(12) United States Patent
Ayranci et al.

(10) Patent No.: US 10,199,996 B2
(45) Date of Patent: Feb. 5, 2019

(54) OPTIMIZED MULTI-LNA SOLUTION FOR WIDEBAND AUXILIARY INPUTS SUPPORTING MULTIPLE BANDS

(71) Applicant: pSemi Corporation, San Diego, CA (US)

(72) Inventors: Emre Ayranci, Costa Mesa, CA (US); Miles Sanner, San Diego, CA (US); Edward Nicholas Comfoltey, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 132 days.

(21) Appl. No.: 15/613,017

(22) Filed: Jun. 2, 2017

(65) Prior Publication Data

US 2018/0351520 A1    Dec. 6, 2018

(51) Int. Cl.
| | |
|---|---|
| *H03F 1/26* | (2006.01) |
| *H03F 3/60* | (2006.01) |
| *H03F 3/195* | (2006.01) |
| *H04B 1/10* | (2006.01) |
| *H03F 1/02* | (2006.01) |
| *H04B 1/00* | (2006.01) |

(52) U.S. Cl.
CPC .......... *H03F 3/195* (2013.01); *H03F 1/0211* (2013.01); *H03F 1/26* (2013.01); *H03F 3/604* (2013.01); *H04B 1/005* (2013.01); *H04B 1/1018* (2013.01); *H03F 2200/294* (2013.01)

(58) Field of Classification Search
CPC .......... H03F 1/0211; H03F 1/26; H03F 3/195; H03F 3/604; H03F 2200/294; H04B 1/005; H04B 1/1018
See application file for complete search history.

(56) References Cited

U.S. PATENT DOCUMENTS

| | | | |
|---|---|---|---|
| 9,716,475 B1 * | 7/2017 | Noori | .......... H03F 1/42 |
| 2005/0079847 A1 * | 4/2005 | Arafa | .......... H04B 7/0805 |
| | | | 455/272 |
| 2013/0244722 A1 * | 9/2013 | Rousu | .......... H04B 1/16 |
| | | | 455/552.1 |
| 2015/0295594 A1 * | 10/2015 | Kehrer | .......... H04B 1/006 |
| | | | 375/316 |
| 2016/0164547 A1 * | 6/2016 | Kim | .......... H04B 1/0057 |
| | | | 455/266 |

* cited by examiner

*Primary Examiner* — Simon Nguyen
(74) *Attorney, Agent, or Firm* — Jaquez Land Greenhaus LLP; Martin J. Jaquez, Esq.; Bruce W. Greenhaus, Esq.

(57) ABSTRACT

A high performance low noise amplifier integrated circuit having multiple low noise amplifiers enabling operation over a wide range for frequencies is disclosed. In particular, an auxiliary input is provided to the low noise amplifier integrated circuit that can be routed to one of several low noise amplifiers, each tuned to operate efficiently in different frequency ranges.

15 Claims, 6 Drawing Sheets

OPTIMIZED MULTI-LNA SOLUTION FOR WIDEBAND AUXILIARY INPUTS SUPPORTING MULTIPLE BANDS

BACKGROUND

(1) Technical Field

The present disclosure relates to wideband low noise amplifiers, and more particularly to a communications front-end module having multiple low noise amplifiers for use with multiple frequency bands.

(2) Background

It is not uncommon for the operational specifications of some communication devices to require that the device receive and process signals in both a first and at least a second relatively narrow frequency band. In some cases, such frequency bands each have a center frequency that is relatively distant from one another. In some cases, inputs can be dedicated to one or more bands that are relatively close in frequency. However, in some cases it is desirable to have an auxiliary (AUX) input that is not designated for use by any particular frequency band. Such AUX inputs can cover several bands within a wide frequency range. Providing such flexibility allows the same module to be reconfigured for use in several geographic regions and to be useful with future revisions. Accordingly, it is desirable for the AUX input to be capable of handling bands that fall over a relatively wide frequency range.

One solution that has been used in mobile front-end modules (FEMs) with low noise amplifier integrated circuits (LNAIC) covering a wide frequency range is to provide a band-switching LNA. Such a band-switching LNA uses switchable caps to optimize the LNA performance based on the desired band of operation. Band-switching LNAs have a size advantage over front-ends that use more than one LNA to cover the frequency range. However, the size advantage comes at the expense of performance. The performance degradation is due to the "off parasitics" of switchable caps used in such band-switching LNA designs. These parasitics have a negative impact on the high-frequency performance of the front-end. In addition, it is not possible to fully optimize each band independently.

In another method, additional external inductor can be used for impedance matching when operating at the lower frequencies. However, using such additional external inductor hurts the performance. In particular, the performance can suffer when such external inductor is used with additional routing capacitances in between matching inductors in systems that have a characteristic routing impedance that differs from 50 ohms. Furthermore, such external components add additional expense to the overall design.

Accordingly, there is a need for a low cost, high performance FEM LNAIC having AUX inputs that can receive inputs in several frequency bands over a broad frequency range.

SUMMARY

The presently disclosed method and apparatus provides a front-end module (FEM) having a low noise amplifier integrated circuit (LNAIC) with an auxiliary (AUX) input that is concurrently coupled to at least two LNAs. Each of the LNAs is excited by the same input (e.g., an input applied to the AUX input port) via a transmission line on the FEM substrate. In some embodiments, the LNAs are tuned to two particular frequency bands and are coupled to input ports dedicated to receive signals in those frequency bands. In an alternative embodiment, the AUX input is coupled to at least one additional LNA that has been tuned to receive frequencies that the other LNAs (i.e., those tuned to service the other input ports) are not efficiently tuned to amplify.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
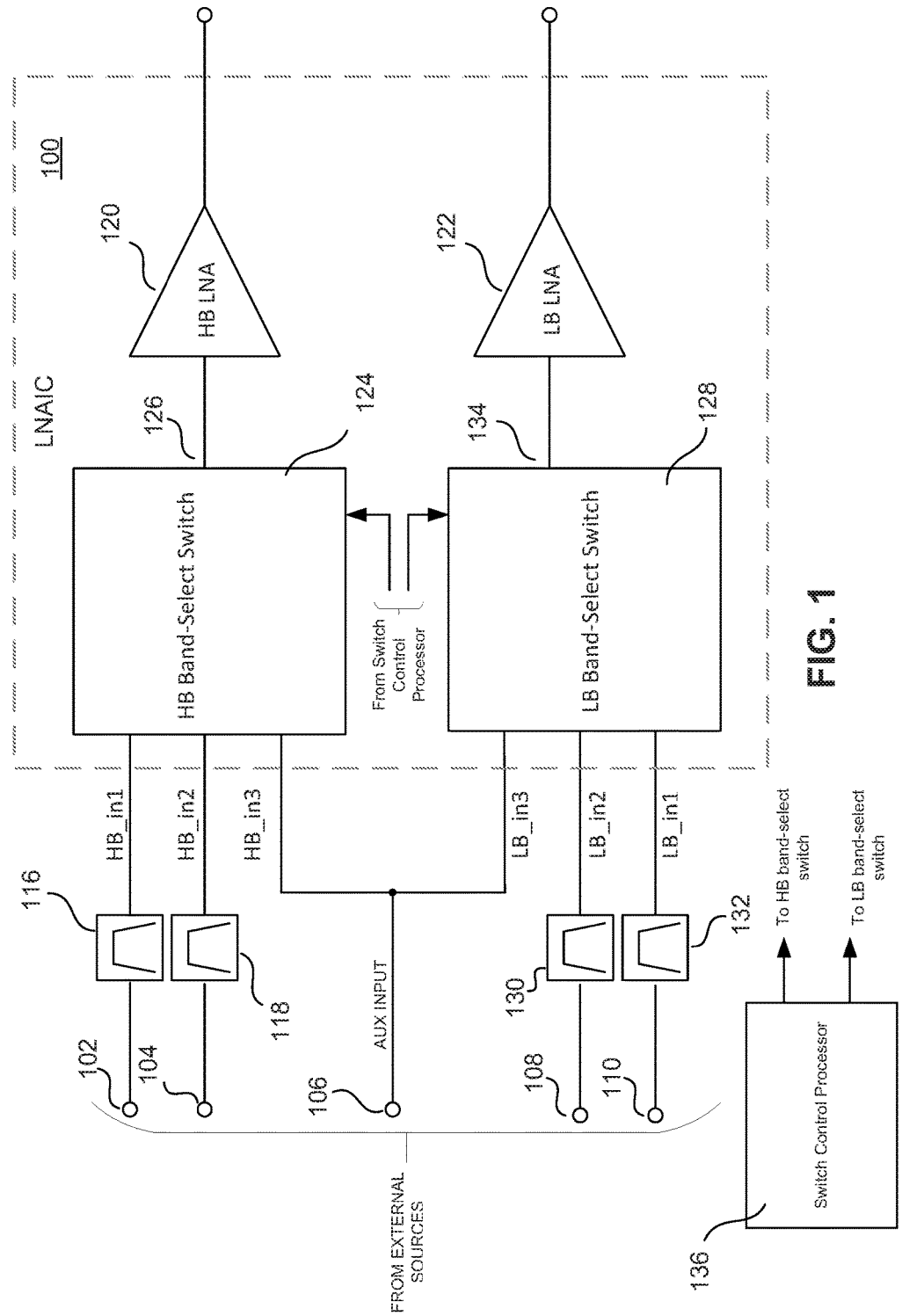
FIG. 1 is a simplified block diagram of one example of a low noise amplifier integrated circuit (LNAIC).

FIG. 1 is a simplified block diagram of one example of a low noise amplifier integrated circuit (LNAIC) 100. FIG. 1 also shows several ports 102, 104, 106, 108, 110 provided to allow external signal sources to be coupled to the LNAIC 100. The external sources are not shown and may be any signal source, such as an antenna, transmission line, etc. In some embodiments, the LNAIC 100 has two LNAs 112, 114. However, in alternative embodiments, several additional LNAs may be present within the LNAIC 100. Signals applied to the first, second and third port 102, 104, 106 are coupled to a corresponding three "high-band" inputs HB_IN1-3 to the LNAIC 100. The first two ports 102, 104 are coupled to the LNAIC 100 through respective bandpass filters 116, 118. In some embodiments, auxiliary (AUX) port 106 is coupled directly to two different inputs HB_IN3 and LB_IN3 of the LNAIC 100.

The first port 102 is provided to allow signals within a predetermined frequency range matching the passband of the bandpass filter 116 to be coupled to the LNAIC 100. Signals coupled by the signal source to the port 102 that fall outside the bandpass of the bandpass filter 116 are rejected by the bandpass filter 116. Therefore, only those signals having frequencies that lie with the bandpass of the filter 116 will be effectively coupled to the HB_IN1 input to the LNAIC 100. Accordingly, the port 102 is effectively dedicated to receive signals within the passband of the filter 116.

The second bandpass filter 118 is tuned to have a passband that does not overlap with the passband of the first bandpass filter 116. In some embodiments, the passband of the first and second bandpass filters 116, 118 are relatively close to one another. Alternatively, the bandpass of the first filter 116 may overlap with the bandpass of the second filter 118, but the passbands are not identical. That is, at least some frequencies passed by one of the filters 116, 118 is rejected by the other.

The passband of each bandpass filter 116, 118 is tuned to pass frequencies for which the first of the two low noise amplifiers 120 is optimized. In some examples, one LNA 120 is tuned to perform relatively better at higher frequencies. Thus, the LNA 120 is designated a "high-band" (HB) LNA. In some such embodiments, the second LNA 122 is tuned to perform better at relatively lower frequencies. Thus, the LNA 122 is designated a "low-band" (LB) LNA. The bandpass filters 130, 132 coupled to the ports 108, 110 are tuned to pass frequencies for which the LB LNA 122 is optimized.

In some embodiments, the output of the HB bandpass filter 116 is coupled to a first input HB_IN1 of an HB band-select switch 124 having three inputs HB_IN1-3. The HB band-select switch 124 selects one of the three inputs HB_IN1-3 and couples the signals applied to the selected input to a band-select switch output 126.

Similarly, the outputs of each of the bandpass filters 130, 132 are coupled to a "low-band" (LB) band-select switch 128. The LB band-select switch 128 has three inputs LB_IN1-3. The LB band-select switch selects signals applied to one of the three inputs LB_IN1-3 to be coupled to a LB band-select switch output 134. The bandpass filter 130 is coupled to the LB_IN1 input. The bandpass filter 132 is coupled to the LB_IN2 input.

As noted above, the signals applied to the first two inputs HB_IN1 and HB_IN2 of the HB band-select switch 124 and the first two inputs LB_IN1 and LB_IN2 of the LB band-select switch 128 are filtered by the bandpass filters 116, 118, 130, 132. However, the signals received through the input port 106 (designated as an Auxiliary (AUX) input port in some embodiments) are directly coupled to the third input HB_IN3 of the HB band-select switch 124 and to the third input LB_IN3 of the band-select switch 128. The signals coupled from the AUX input 106 are not filtered prior to being coupled to the band-select switches 124, 128 to allow flexibility in the frequency range of the signals that are applied to the AUX input 106. Furthermore, in some embodiments, when signals are applied to the AUX input, no signals are applied to any of the other ports 102, 104, 108, 110. Accordingly, when signals applied to the AUX input lie within the frequency range for which the HB LNA 120 is optimized, those signals can be routed to the HB LNA 120. Alternatively, when the signals lie within a frequency range from which the LB LNA 122 is optimized, the signals applied to the AUX input can be routed to the LB LNA 122. In other embodiments, the LNAIC 100 has an AUX input rather than an HB_IN3 input and an LB_IN3 input. The LNAIC 100 couples the AUX input to inputs of each of the band-select switches 124, 128.

In some embodiments, a switch control processor 136 controls the band-select switches 124, 128. Further details regarding the switch control processor 136 are provided below.

Figure 2:
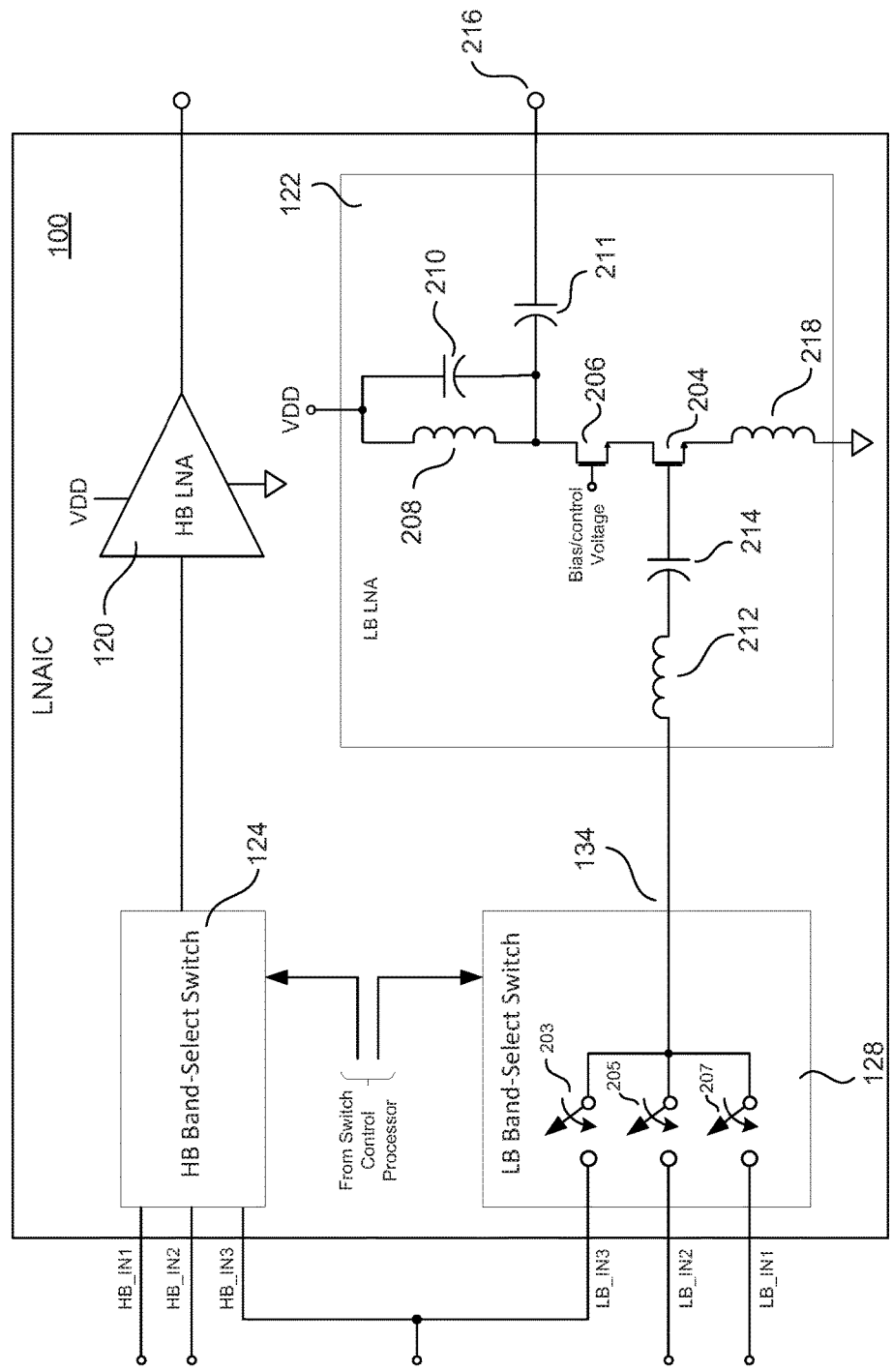
FIG. 2 is a slightly more detailed illustration of the LNAIC of FIG. 1.

FIG. 2 is a slightly more detailed illustration of the LNAIC 100. In some embodiments, each band-select switch 124, 128 is essentially identical. However, in some embodiments, the switches 124, 128 may also be optimized for operation in the frequency range associated with the input ports 102, 104, 108, 110 (see FIG. 1) from which they receive their respective signals. Therefore, for the sake of simplicity, the details of only the LB band-select switch 128 and the LB LNA 122 are shown and discussed.

The LB band-select switch 128 provides a path from one of the inputs LB_IN1-3 to an output 134 of the band-select switch 128. The path is established by closing one of three switches 203, 205, 207. For the sake of simplicity each of the switches 203, 205, 207 are shown as simple single pole, single throw switches. However, in some embodiments, all of the switches in the LNAIC 100 are implemented using FETs that can be turned on to close the switch (i.e., be biased to have minimal resistance from drain to source) or turned off to open the switch (i.e., be biased to have substantial resistance between drain and source). It should be noted that the "switch" can be of any form, including an absorptive switch, a reflective open switch (as shown) or a reflective short. In some such embodiments, the switches are opened and closed by signals generated by the switch control processor 136. The signal generated to control a particular is coupled to the gate of that switch. The logical state of the signals coupled to the switches determines whether the switch is open or closed.

In some embodiments, samples of the signals coupled to each of the inputs LB_IN1-3 and HB_IN1-3 are provided to the switch control processor 136. For the sake of simplicity, connections between the inputs LB_IN1-3, HB_IN1-3 are not shown. Nonetheless, in some embodiments, the samples are analyzed to determine the amount of power in each frequency band of interest. The processor then determines which switches are to be closed and which open based on the amount of power in each frequency for each signal present at the inputs LB_IN1-3 and HB_IN1-3. For example, if signals applied to the input LB_IN1 is the only LB input having a significant amount of power in the frequency bands to which the LB amplifier is tuned to operate (i.e., the LB frequency bands), then the switch control processor 136 closes the switch 207 between the LB_IN1 input and the LB LNA input. If more than one input LB_IN1-3 has a significant amount of power within the LB frequency band, then algorithms executed by the switch control processor can determine which signals to select to be couple to the LB LNA input (i.e., whether to close switch 203, 205 or 207). In some embodiments, the algorithm may select based on the input that has the most power within the LB frequency bands. In another embodiment, the algorithm may select the input that has the least out-of-band signal power (i.e., power outside the LB frequency bands). In yet another embodiment, the switch control processor 136 selects the input to be coupled to the LB LNA based on a preprogrammed hierarchy. That is, LB_IN1 is coupled to the LB LNA input if there is a signal present having power within the LB frequency bands that is above a threshold, regardless of the signals applied to the LB_IN2 input and the LB_IN3 input. Otherwise, if a signal is present at the LB_IN2 input that has power within the LB frequency bands that is above a threshold, LB_IN2 is coupled to the LB LNA input. It should be clear that several such algorithms can be implemented by the switch control processor 136, including algorithms having multiple thresholds to determine the relative priority of each input LB_IN1-3. In some embodiments, a low frequency primary signal is routed to LB_IN1 or alternatively, a high frequency primary signal is routed to HB_IN1. The AUX port is routed to whichever of the two LNAs is unused (i.e., the HB LNA if the primary signal is a low frequency signal and the LB LNA if the primary signal is a high frequency signal) in order to "monitor" the entire spectrum.

Alternatively, mechanical switches or other input devices can be used to allow a user to indicate whether each switch should be open or closed. Still further, a remote switch control processor (not shown) that resides in another part of a system in which the LNAIC 100 resides provides signals that control the switches.

The output 134 of the LB band-select switch 128 is coupled to the input of the LB LNA 122. In some embodiments, the LB LNA 122 is a simple cascode amplifier having an input FET 204 arranged in a common source configuration coupled to an output FET 206 arranged in a common gate configuration. The source of the output FET 206 is coupled to the drain of the input FET 204. The output 134 of the LB band-select switch 128 is coupled to the gate of the input FET 204. In some embodiments, the LB LNA 122 is an amplifier having a single FET 204 arranged in a common source configuration. In yet other embodiments, the LB LNA 122 is an amplifier having multiple common-gate devices (e.g., FETs) in a stacked device configuration.

In some embodiments, a bias/control voltage is applied to the gate of the output FET 206. The bias/control voltage can be used to turn the LB LNA 122 on or off, as well as ensure that the LB LNA 122 is biased to operate in a linear operating region when turned on. In some embodiments, the bias/control voltage is generated by the switch control processor 136. Alternatively, the bias/control voltage is applied and removed by opening or closing a switch (not shown) coupled between a bias/control voltage source and the gate of the output FET 206. In some embodiments, such a switch is controlled by the switch control processor 136. Still further, the bias/control voltage is generated external to the LNAIC 100 and coupled to a port of the LNAIC 100. The drain of the output FET 206 is coupled to a supply voltage (VDD). An inductance 208 and a capacitance 210 are placed in parallel between the drain of the output FET 206 and the voltage source VDD. The output of the LB LNA 122 is taken from the drain of the output FET 206. An output capacitor 211 is placed in series between the drain of the output FET 206 and the LNA output 216.

In some embodiments, an electrical conductor that couples the output of the LB band-select switch 128 to the gate of the LB LNA 122 has an inductance 212 that can be modeled as a lumped inductance. In addition, in some embodiments, a direct current (DC) blocking capacitor 214 is provided to ensure proper biasing of the input FET 204. A degeneration inductance 218, which in some embodiments is the inherent inductance of a conductor, is placed between the source of the input FET 204 and ground.

By selecting between the three inputs LB_IN1-3, the LB band-select switch 128 can select which input is to be routed to the LB LNA input and amplified by the LNAIC 100. Likewise, the HB band-select switch 124 can select which input HB_IN1-3 is to be routed to the input of the HB LNA 120.

Figure 3:
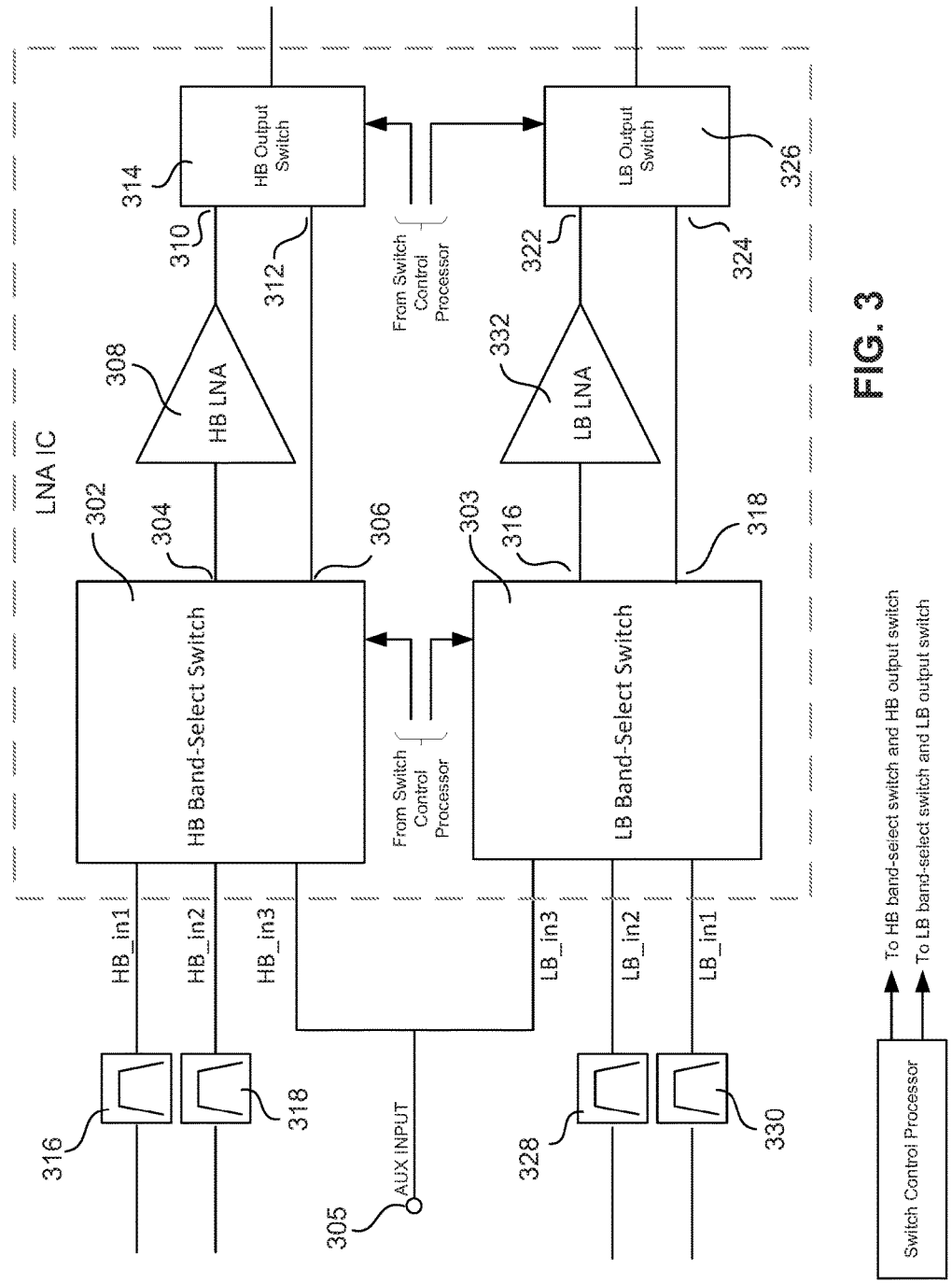
FIG. 3 is a simplified block diagram of another embodiment of an LNAIC.

FIG. 3 is a simplified block diagram of another embodiment of an LNAIC 300. The LNAIC 300 has six input ports HB_IN1-3 and LB_IN1-3, similar to the LNAIC 100. The first three input ports HB_IN1-3 to the LNAIC are coupled to an HB band-select switch 302. The other three input ports LB_IN1-3 are coupled to an LB band select switch 303. The first input HB_IN1 to the LNAIC 300 is coupled to a first HB bandpass filter 316. The second input HB_IN2 to the LNAIC 300 is coupled to a second HB bandpass filter 318. Similar to the bandpass filters 116, 118 discussed with respect to the LNAIC 100, each of the HB bandpass filters 316, 318 are tuned to a unique frequency band for which the HB LNA 308 is optimized. Each of the LB bandpass filters 328, 330 is tuned to a unique frequency band for which the LB LNA 332 is optimized. An AUX input port 305 is coupled to the HB_IN3 and LB_IN3 inputs to the LNAIC 300. In an alternative embodiment, the LNAIC 300 has an AUX input that is coupled to the HB_IN3 input of the HB band-select switch 302 and also to the LB_IN3 input of the LB band-select switch 303. That is, the LNAIC 300 has a single connection to the AUX input 305.

The HB band-select switch 302 has two outputs 304, 306. The HB band-select switch 302 can select the signals applied to any of the three inputs HB_IN1-3 and couple the selected signals to the first output 304. The first output 304 is coupled to the input of an HB LNA 308. The output of the HB LNA is coupled to a first of two inputs 310, 312 to an HB output switch 314.

The second output 306 of the HB band-select switch 302 is coupled to a second input 312 of the HB output switch 314. As is the case with the first output 304, the HB band-select switch 302 can select the signals applied to any of the three inputs HB_IN1-3 and couple the selected signals to the second output 306. Similar to the HB band-selector switch 302, the LB band-selector switch 303 has two outputs 316, 318. The first output 316 is coupled to the input of an LB LNA 320. The second output 318 of the LB band-select switch 303 is coupled to a second input 324 of an LB output switch 326. The output of the HB LNA 320 is coupled to a first input 322 to the LB output switch 326.

Figure 4:
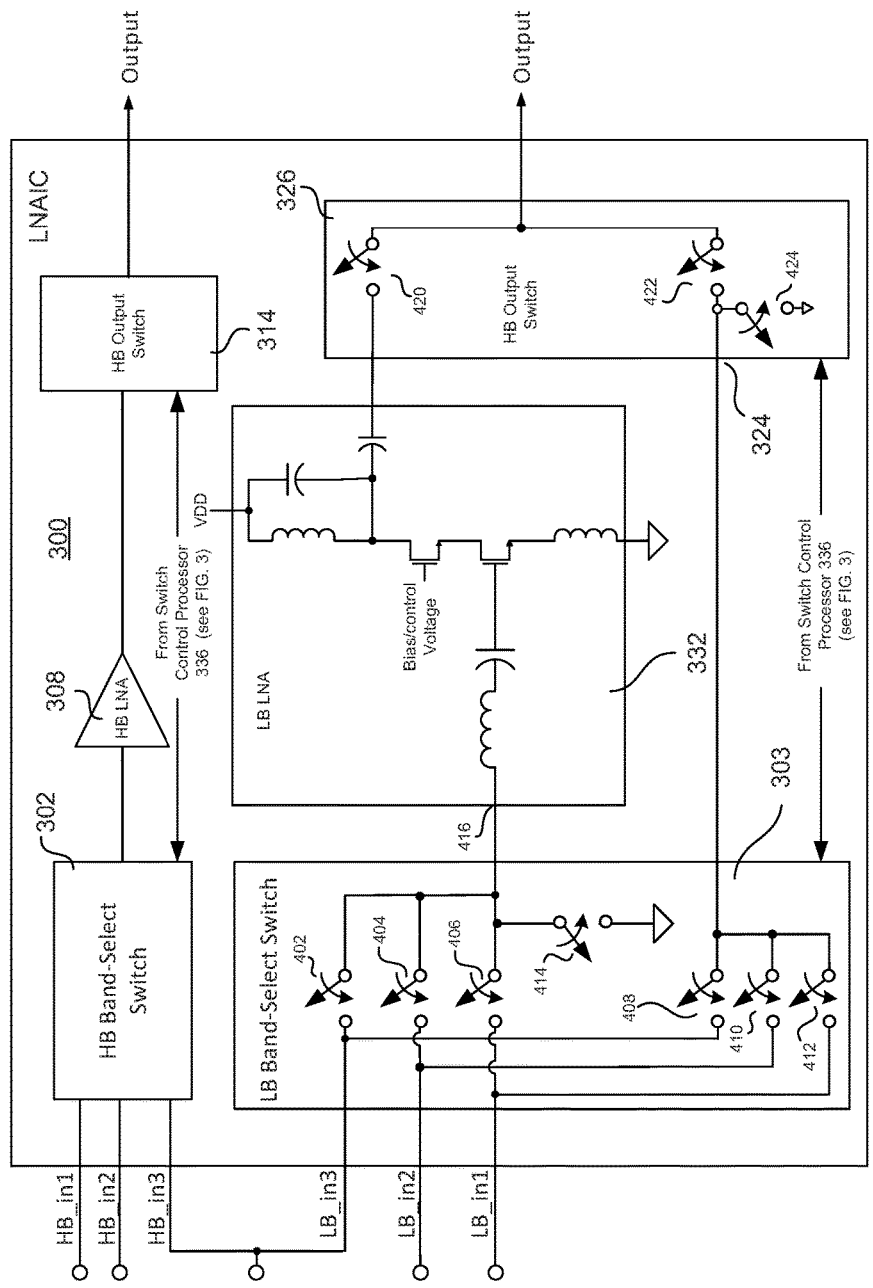
FIG. 4 is a more detailed illustration of the LNAIC of FIG. 3.

FIG. 4 is a more detailed illustration of the LNAIC 300. The two band-select switches 302, 303, LNAs 308, 322 and output switches 314, 326 are essentially identical. Accordingly, only the low band (LB) components (i.e., LB band-select switch 303, LB LNA 322 and LB output switch 326) are discussed. Nonetheless, in some embodiments, each of the components 302, 303, 314, 326 is optimized to operate in the frequency range for which the associated LNA 308, 322 is optimized to operate.

The LB band-select switch 303 has seven internal switches 402, 404, 406, 408, 410, 412, 414. The first three switches 402, 404, 406 provide a path for the LB band-select switch 303 to couple one of the three inputs LB_IN1-3 to the input of the LB LNA 322 (i.e., "select" signals applied to one of the input ports). The next three switches 408, 410, 412 provide a path for the LB band-select switch 303 to couple one of the inputs LB_IN1-3 directly to the second input 324 of the LB output switch 326. In some embodiments, only one of the first six switches 402, 404, 406, 408, 410, 412 is turned on at a time. Accordingly, signals from only one of the inputs LB_IN1-3 are coupled to the LB LNA 332 or directly to the second input of the LB output switch 324, but not both. In some alternative embodiments, a combination of the switches can be activated (i.e., closed) and the output switches 314, 326 can select the signal to be routed to the output.

In addition, the seventh switch 414 within the LB band-select switch 303 provides a path from the input 416 of the LB LNA to ground. The switch 414 is closed when each of the three switches 402, 404, 406 are open. Shorting the input of the LB LNA 332 to ground better controls the impedance of the LB LNA when it is not in use, and reduces the risk of unwanted impedances getting closer to short negatively impacting the HB LNA performance. In addition, in some embodiments, a bias/control voltage is applied to the gate of an output FET 418 to turn the LB LNA 332 off when all of the switches 402, 404, 406 are open. The LB output switch 326 has three internal switches 420, 422, 424. For the sake of simplicity each of the switches 402, 404, 406, 408, 410, 412, 420, 422, 424 are shown as simple single pole, single throw switches. However, in some embodiments, similar to the LNAIC 100 discussed above, all of the switches in the LNAIC 300 are implemented using FETs that can be turned on to close the switch or turned off to open the switch. In some such embodiments, the switches are opened and closed by signals generated by the switch control processor 336. The signal generated to control a particular is coupled to the gate of that switch. The logical state of the signals coupled to the switches determines whether the switch is open or closed. Similar to the LNAIC 100 discussed above, in some embodiments the signals applied to the inputs LB_IN1-3, HB_IN1-3 are sampled and the samples are coupled to the switch control processor 336 for analysis in order to allow the switch control processor 336 to determine how to set the switches 402, 404, 406, 408, 410, 412, 420, 422, 424. Alternatively, the control signals can be provide in any of the ways discussed above with regard to the LNAIC 100. In some embodiments, the inputs to each switch can be selectively terminated when unused using an Absorptive or Reflective Short shunt switch arm. If the signals are sampled and the samples are coupled to the switch control processor 336 for analysis, a determination can be made that the input is unused.

In some embodiments, either the first switch 420 or the second switch 422 is closed to provide a path either from the output of the LB LNA 332 to the LNAIC output, or alternatively, from the one of the inputs LB_IN1-3 to the LNAIC output when one of the switches 408, 410, 412 are closed within the LB band-select switch 303. The third switch 424 is an LB ground switch that provides a path from the second input 324 to ground. The LB ground switch 424 may be closed when the LB LNA 332 is inactive (i.e., the AUX input is coupled to the HB LNA 308 or signals are applied to the HB_IN1 input or HB_IN2 input and no signals are applied to the LB_IN1 input or LB_IN2 input). In that case, the switch 402 coupled to the LB_IN3 port is open. In some embodiments, the switches 404, 406 are also open when the HB LNA 308 is active. By closing the LB ground switch 424 when none of the switches 408, 410, 412 in the LB band-select switch are closed, the impedance at the node between switch 303 and switch 324 can be better controlled. Thus, the likelihood of unwanted resonance or oscillations can be reduced or eliminated.

The LB LNA 332 and HB LNA 308 are essentially the same as the LB LNA 122 and HB LNA 120 described above with respect to the LNAIC 100 of FIG. 1 and FIG. 2.

Methods

Figure 5:
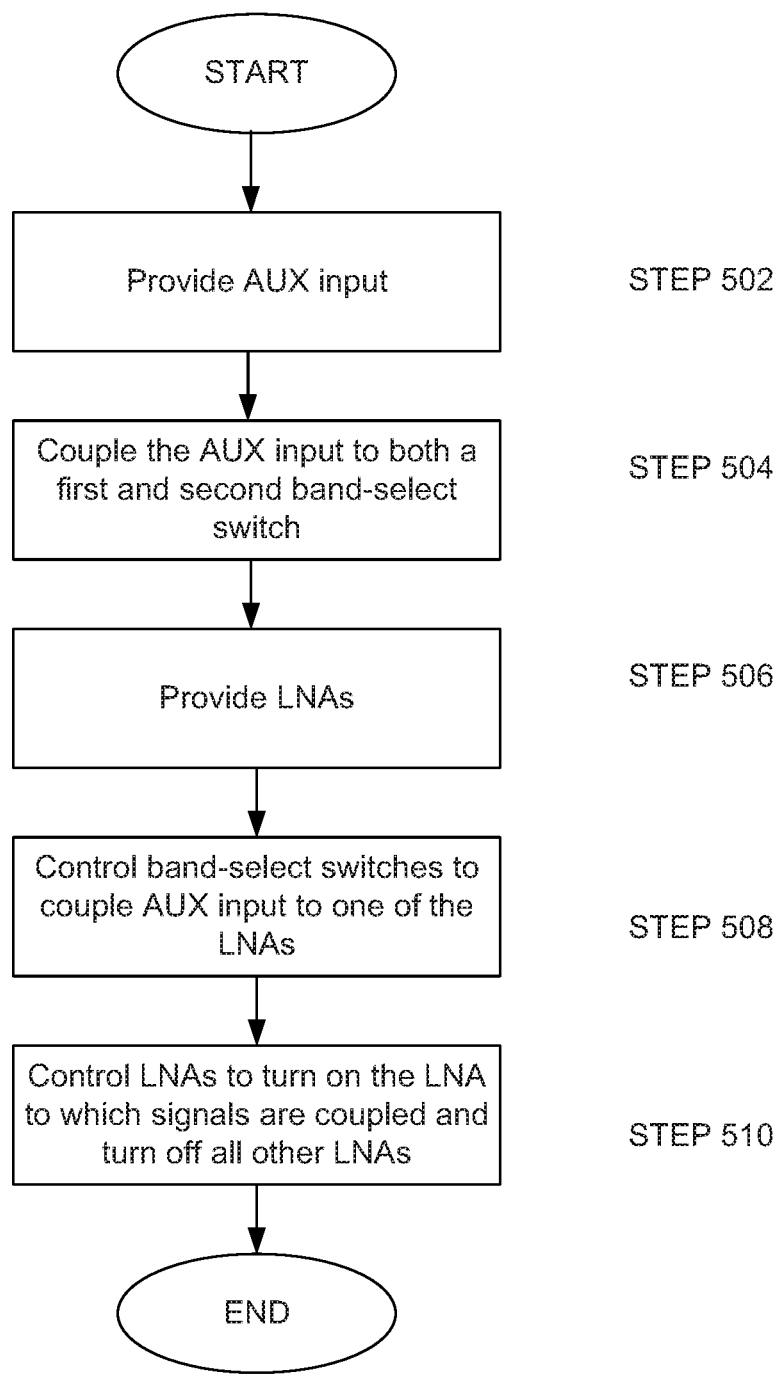
FIG. 5 is a flowchart illustrating a method for efficiently amplifying signals coupled to an auxiliary (AUX) input, wherein the signals can be in any frequency band selected from a broad range of frequency bands.

FIG. 5 is a flowchart illustrating a method 500 for efficiently amplifying signals coupled to an auxiliary (AUX) input, wherein the signals can be in any frequency band selected from a broad range of frequency bands. Initially, an AUX input is provided (STEP 502). The AUX input is coupled to at least a first and second band-select switch (STEP 504). At least a first and second LNA are provided, each tuned to operate over a unique frequency range (STEP 506). Each LNA is coupled to a corresponding one of the band select switches. The first and second band-select switches are controlled to route signals applied to the AUX input to one of the LNAs (STEP 508). In one embodiment, the method further includes controlling the LNA to which signals from the AUX input is coupled by applying a bias/control voltage to the gate of an output FET within the LNA (STEP 510). In some embodiments, the step of controlling the band-select switches includes determining whether signals applied to the AUX input are within an LB frequency band to which an LB LNA has been tuned to operate or an HB frequency band to which an HB LNA has been tuned to operate.

Figure 6:
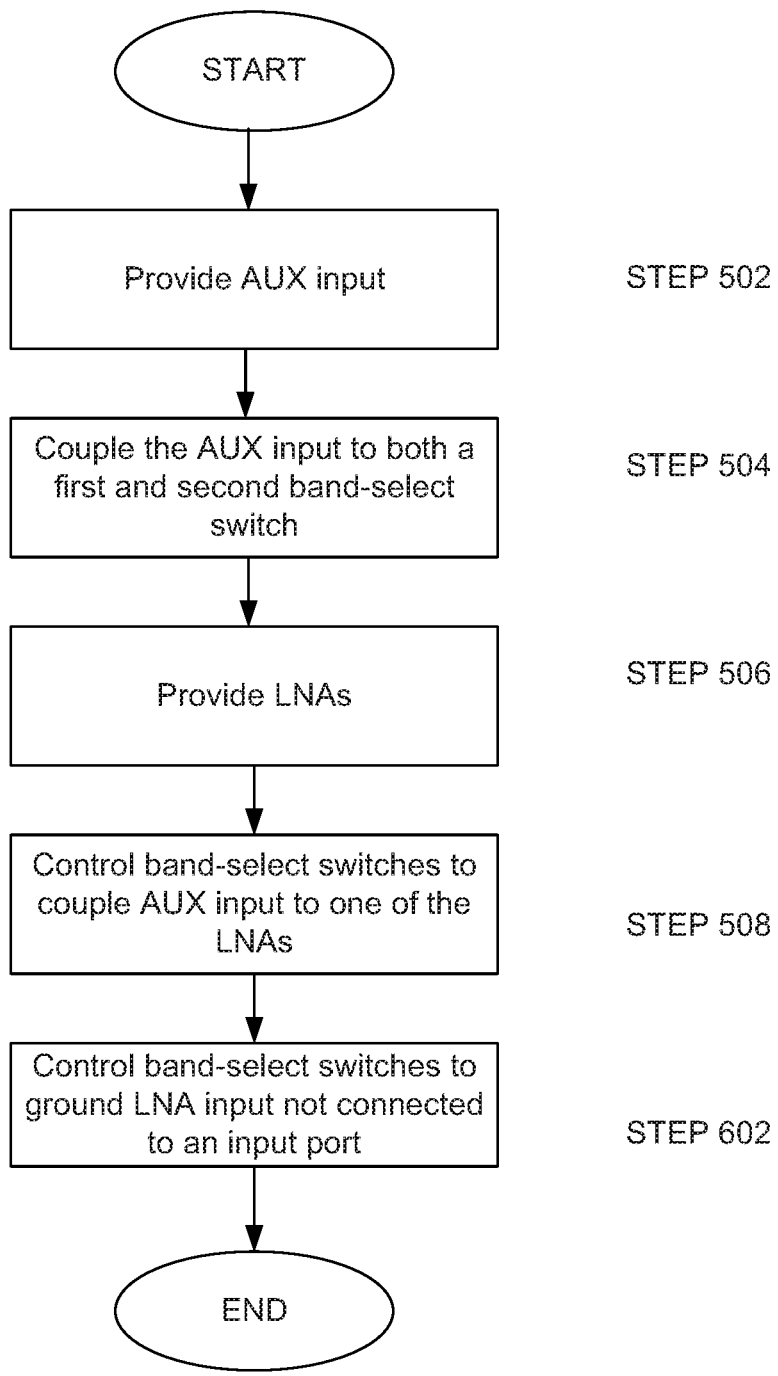
FIG. 6 is a flowchart of another method for efficiently amplifying signals coupled to an AUX input, wherein the signals can have any frequency from among a broad range of frequency bands.

FIG. 6 is a flowchart of another method 600 for efficiently amplifying signals coupled to an AUX input, wherein the signals can have any frequency from among a broad range of frequency bands. Initially, step 502 through step 508 are performed similar to the method 500 of FIG. 5. In addition, the method 600 further includes providing at least one output switch, each output switch associated with a band-select switch, LNA and LNAIC output (STEP 602). The outputs of a band-select switch are grounded when the associated LNA is not active (STEP 604). In some embodiments, the method further includes controlling the output switch to couple either the output of the associated LNA or an output of the associated band-select switch to an associated LNAIC output (STEP 606).

Fabrication Technologies and Options

The term "FET" means any transistor that has an insulated gate whose voltage determines the conductivity of the transistor. Various embodiments may be implemented in any suitable IC technology or in hybrid or discrete circuit forms. For example, embodiments may be fabricated using any suitable substrates and processes, including but not limited to standard bulk silicon, silicon-on-insulator (SOI), silicon-on-sapphire (SOS), bipolar, BiCMOS, SiGe HBT, GaAs HBT, GaN HEMT, GaAs pHEMT, and MESFET technologies. However, the concepts described above are particularly useful with an SOI-based fabrication process (including SOS), and with fabrication processes having similar characteristics.

A number of embodiments have been described. It is to be understood that various modifications may be made without departing from the spirit and scope of the claimed invention. For example, voltage polarities may be reversed depending on a particular specification and/or implementing technology (e.g., NMOS, PMOS, CMOS, or BJT and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. In addition, some of the steps described above may not be dependent on the order in which they are performed, and thus can be performed in an order different from that described above. Further, some of the steps described above may be optional. Various activities described with respect to the methods identified above can be executed in repetitive, serial, or parallel fashion. Furthermore, throughout the disclosure, switches can be implemented as absorptive, reflective open or reflective short devices. Still further, it should be noted that while two bands are shown throughout the disclosure, any number of bands are within the scope of the disclosed method and apparatus. Accordingly, any number of band-select switches and associated LNAs and output switches may be included. Similarly, each band select-switch can select to couple any number of inputs to any number of outputs.

Furthermore, although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations or across multiple technologies.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A low noise amplifier integrated circuit (LNAIC) comprising:
   a first low noise amplifier (LNA) having an input and an output;
   a second LNA having an input and an output;
   a first input select switch having at least two inputs, at least one input being an auxiliary (AUX) input, the input select switch configured to couple at least one of the inputs to the first LNA input; and
   an second input select switch having at least two inputs, including at least one AUX input, the second input select switch configured to couple at least one of the inputs to the second LNA input;
   wherein the AUX input of the first select switch is coupled to the AUX input of the second select switch.

2. The LNAIC of claim 1, wherein:
   the first LNA is a low band (LB) LNA tuned for operation in an LB frequency range, the LB LNA having an input and an output;
   the second LNA is a high band (HB) LNA tuned for operation in a corresponding HB frequency range, the HB LNA having an input and an output;
   the first input select switch is a LB band-select switch configured to receive signals within the LB frequency range; and
   the second input select switch is an HB band-select switch configured to receive signals within the HB frequency range.

3. The LNAIC of claim 2, wherein the LB band-select switch configured to couple the AUX input to the LB LNA input upon receiving, at the AUX input, signals within the LB frequency range and the HB band-select switch configured to couple the AUX input to the corresponding HB LNA upon receiving, at the AUX input, signals within the HB frequency range.

4. A low noise amplifier integrated circuit (LNAIC) comprising:
   an LB low noise amplifier (LNA) tuned for operation in an LB frequency range and having an input and an output;
   an HB LNA tuned for operation in a corresponding HB frequency range and having an input and an output;
   an LB band-select switch having at least one input configured to be coupled to an auxiliary (AUX) input of a front-end module, the LB band-select switch including an first switch coupled between the AUX input and the LB LNA, wherein the first switch is closed upon receiving, at the AUX input, signals within the LB frequency range; and
   an HB band-select switch having at least one input coupled to the AUX input, the HB band-select switch including a first switch coupled between the AUX input and the corresponding HB LNA, wherein the first switch is closed upon receiving, at the AUX input, signals within the HB frequency range.

5. The LNAIC of claim 4, wherein:
   the LB band-select switch includes a second input configured to receive signals that are within a first band within the LB frequency range;
   the LB band-select switch includes at least a second switch coupled between the second input and the first LNA;
   a second input to the HB band-select switch is configured to receive signals that are within a first band of the HB frequency range; and
   the HB band-select switch includes second switch coupled between the second input and the input to the HB LNA.

6. The LNAIC of claim 5, further including:
   a third input to the LB band-select switch configured to receive signals that are within a second band of the LB frequency range;
   a third switch within the LB band-select switch, coupled between the input to the LB LNA and the third input to the LB band-select switch;
   a third input to the HB band-select switch configured to receive signals that are within a second band of the HB frequency range; and
   a third switch within the HB band-select switch, coupled between the third input and the HB LNA.

7. The LNAIC of claim 4, further including a switch control processor coupled to the LB band-select switch and to the HB band-select switch to open and close the first switch in the LB band-select switch and to open and close the first switch in the HB band-select switch.

8. The LNAIC of claim 4, further including:
at least one additional LNA tuned for operation in a corresponding frequency range and having an input and an output;
at least one additional band-select switch having a plurality of inputs, including at least one input configured to be coupled to the auxiliary (AUX) input of a front-end module, the at least one additional band-select switch including an first switch coupled between the AUX input and a corresponding one of the at least one additional LNAs, wherein the first switch is closed upon receiving, at the AUX input, signals within the corresponding frequency range.

9. The LNAC of claim 4, further including:
an LB output switch having a first and second input and an output, the LB output switch having a first switch configured to selectively provide a path from the first input to the output or alternatively, from the second input to the output and having a second switch coupled between the first input and ground to selectively provide a path from the first input to ground; and
an HB output switch having a first and second input and an output, the HB output switch having a first switch configured to selectively provide a path from the first input to the output or alternatively, from the second input to the output and having a second switch coupled between the first input and ground to selectively provide a path from the first input to ground;
wherein:
the first input of the LB output switch is coupled to the LB LNA output;
the second input to the LB output switch is coupled to a second output of LB band-select switch;
the LB band-select switch has a second switch to selectively provide a path between the AUX input and the second output from the LB band-select switch.

10. The LNAIC of claim 9, wherein:
the LB band-select switch further includes a third switch coupled between the first output of the LB band-select switch and ground; and
the HB band-select switch further includes a third switch coupled between the first output of the HB band-select switch and ground.

11. A method for efficiently amplifying signals coupled to an auxiliary (AUX) input of a front-end module, including:
providing an AUX input to the front-end module;
providing a low band (LB) band-select switch and a high band (HB) band-select switch;
coupling the AUX input to an input of both the LB band-select switch and the HB band-select switch;
providing an LB low noise amplifier (LNA) tuned to operate in an LB frequency range and a HB LNA tuned to operate in an HB frequency range;
controlling the LB band-select switch and the HB band-select switch to route signals applied to the AUX input to one of the LB LNA or the HB LNA.

12. The method of claim 11, further wherein controlling the LB band-select switch and the HB band-select switch includes selecting between the routing the signals from the AUX input to the LB LNA if the signals applied to the AUX input are in the LB frequency range and to the HB LNA if the signals are in the HB frequency range.

13. The method of claim 11, further including:
providing a dedicated LB input for LB frequency signals;
providing a dedicated input for HB frequency signals;
coupling the dedicated LB input to the LB LNA when signals within the LB frequency range are applied to the dedicated LB input; and
coupling the dedicated HB input to the HB LNA when signals within the HB frequency range are coupled to the HB input.

14. The method of claim 13, further including:
grounding the input to the LB LNA when the LB LNA is not active; and
grounding the input to the HB LNA when the HB LNA is not active.

15. The method of claim 14, further including:
grounding the outputs from the LB band-select switch when the LB LNA is not active; and
grounding the outputs from the HB band-select switch when the HB LNA is not active.

* * * * *